United States Patent
Cho et al.

(10) Patent No.: US 9,843,023 B2
(45) Date of Patent: Dec. 12, 2017

(54) DISPLAY DEVICE AND MANUFACTURING METHOD THEREOF

(71) Applicants: SAMSUNG DISPLAY CO., LTD., Yongin-si, Gyeonggi-Do (KR); POSTECH ACADEMY-INDUSTRY FOUNDATION, Pohang-si, Gyeongsangbuk-do (KR)

(72) Inventors: Sanghwan Cho, Yongin-si (KR); Seungyong Song, Yongin-si (KR); Jonglam Lee, Pohang-si (KR); Chungsock Choi, Yongin-si (KR); Bola Lee, Pohang-si (KR); Illhwan Lee, Pohang-si (KR)

(73) Assignees: SAMSUNG DISPLAY CO., LTD., Yongin-Si, Gyeonggi-Do (KR); POSTECH ACADEMY-INDUSTRY FOUNDATION, Pohang-si, Gyeongsangbuk-do (KR)

( * ) Notice: Subject to any disclaimer, the term of this patent is extended or adjusted under 35 U.S.C. 154(b) by 0 days.

(21) Appl. No.: 14/837,045

(22) Filed: Aug. 27, 2015

(65) Prior Publication Data

US 2016/0190519 A1 Jun. 30, 2016

(30) Foreign Application Priority Data

Dec. 29, 2014 (KR) ........................ 10-2014-0192547

(51) Int. Cl.
*H01L 33/00* (2010.01)
*H01L 51/52* (2006.01)

(52) U.S. Cl.
CPC ...... *H01L 51/5275* (2013.01); *H01L 51/5253* (2013.01)

(58) Field of Classification Search
CPC ............. H01L 31/0543; H01L 51/5253; H01L 51/5275
USPC ..................................................... 257/90–100
See application file for complete search history.

(56) References Cited

U.S. PATENT DOCUMENTS

| 6,413,645 B1 | 7/2002 | Graff et al. |
| 9,627,647 B2 * | 4/2017 | Kim ................... H01L 51/5253 |
| 2005/0051791 A1 * | 3/2005 | Gotoh ................ H01L 51/5262 257/99 |
| 2009/0305062 A1 | 12/2009 | Choi et al. |

(Continued)

FOREIGN PATENT DOCUMENTS

| KR | 10-0649220 B1 | 11/2006 |
| KR | 10-2009-0126863 A | 12/2009 |

(Continued)

*Primary Examiner* — Brook Kebede
(74) *Attorney, Agent, or Firm* — Lee & Morse, P.C.

(57) ABSTRACT

A display device including a substrate, a display unit on the substrate and including a display element for displaying an image, at least one organic encapsulation film formed on the display unit, and at least one refractive-index control encapsulation film adjacent to the at least one organic encapsulation film. A refractive index of a region of the at least one refractive-index control encapsulation film closer to the at least one organic encapsulation film is closer to a refractive index of the at least one organic encapsulation film than is a refractive index of a region of the at least one refractive-index control encapsulation film further from the at least one organic encapsulation film.

20 Claims, 4 Drawing Sheets

(56) References Cited

U.S. PATENT DOCUMENTS

2012/0256218 A1  10/2012  Kwack et al.
2014/0077183 A1   3/2014  Lee et al.
2014/0322851 A1* 10/2014  Kim .................... C23C 14/086
                                              438/46

FOREIGN PATENT DOCUMENTS

KR   10-2012-0115841 A   10/2012
KR   10-2014-0035736 A    3/2014

* cited by examiner

DISPLAY DEVICE AND MANUFACTURING METHOD THEREOF

CROSS-REFERENCE TO RELATED APPLICATION

Korean Patent Application No. 10-2014-0192547, filed on Dec. 29, 2014, in the Korean Intellectual Property Office, and entitled: "Display Device and Manufacturing Method Thereof," is incorporated by reference herein in its entirety.

BACKGROUND

1. Field

One or more exemplary embodiments relate to a display device and a manufacturing method thereof.

2. Description of the Related Art

Display devices are devices that display an image. Recently, much attention has been paid to organic-light emitting diode display devices.

An organic-light emitting diode display device includes a hole injection electrode, an electron injection electrode, and an organic light-emitting diode (OLED) that is disposed between the hole injection electrode and the electron injection electrode and includes an organic emission layer. The organic-light emitting diode display device is a self-emitting display device in which light is generated when holes emitted from the hole injection electrode and electrons emitted from the electron injection electrode are combined to generate excitons.

Since organic-light emitting diode display devices do not require an additional light source, the organic-light emitting diode display devices may be driven with a low voltage and manufactured to be light and thin. Also, the organic-light emitting diode display devices have high-quality characteristics, e.g., a wide viewing angle, a high contrast, and a high response rate. Thus, the organic-light emitting diode display devices have drawn attention as next-generation display devices.

However, since an organic-light emitting diode display device easily deteriorates due to external moisture, oxygen, etc., an OLED is sealed to protect the organic-light emitting diode display device against external moisture, oxygen, etc. Recently, in order to manufacture an thin-film type and/or flexible organic-light emitting diode display device, a multi-layer thin film encapsulation (TFE) structure including either a plurality of inorganic films or organic and inorganic films has been introduced as a device for sealing the OLED. However, the transmittance of light emitted from an organic emission layer decreases when the light passes through the multi-layer TEF structure, thereby lowering the efficiency of the whole display device.

SUMMARY

According to one or more exemplary embodiments, a display device includes a substrate; a display unit formed on the substrate and including a display element for displaying an image; at least one organic encapsulation film formed on the display unit; and at least one refractive-index control encapsulation film formed adjacent to the at least one organic encapsulation film, wherein a refractive index of a region of the at least one refractive-index control encapsulation film closer to the at least one organic encapsulation film is closer to a refractive index of the at least one organic encapsulation film than is a refractive index of a region of the at least one refractive-index control encapsulation film further from the at least one organic encapsulation film.

In one embodiment, the refractive index of the at least one refractive-index control encapsulation film gradually increases from the region of the at least one refractive-index control encapsulation film closer to the at least one organic encapsulation film towards the region of the at least one refractive-index control encapsulation film further from the at least one organic encapsulation film.

In one embodiment, the at least one refractive-index control encapsulation film may include an inorganic material.

In one embodiment, the at least one refractive-index control encapsulation film may include a silicon oxide.

In one embodiment, the display device may further include at least one inorganic encapsulation film formed on the display unit; wherein the at least one refractive-index control encapsulation film is disposed between the at least one organic encapsulation film and the at least one inorganic encapsulation film.

In one embodiment, the refractive index of the at least one refractive-index control encapsulation film may gradually increase from the at least one organic encapsulation film towards the at least one inorganic encapsulation film.

In one embodiment, the at least one refractive-index control encapsulation film may be thinner than the at least one inorganic encapsulation film.

In one embodiment, the display device may include a plurality of organic encapsulation films on the display unit, the at least one refractive-index control encapsulation film is between two adjacent organic encapsulation films among the plurality of organic encapsulation films, and the refractive index of the at least one refractive-index control encapsulation film gradually increases from side surfaces of the at least one refractive-index control encapsulation film facing the two adjacent organic encapsulation films towards a center of the at least one refractive-index control encapsulation film.

In one embodiment, the at least one refractive-index control encapsulation film may include: a first control encapsulation film; and a second control encapsulation film formed adjacent to the first control encapsulation film and arranged to be more distant from the at least one organic encapsulation film than the first control encapsulation film, wherein a refractive index of the first control encapsulation film is closer to the refractive index of the at least one organic encapsulation film than a refractive index of the second control encapsulation film.

In one embodiment, the refractive index of the first control encapsulation film may be less than the refractive index of the second control encapsulation film.

In one embodiment, the first control encapsulation film may include a silicon oxide.

In one embodiment, the first control encapsulation film may be thinner than the second control encapsulation film.

In one embodiment, the at least one refractive-index control encapsulation film may further include a third control encapsulation film, the second control encapsulation film is between the first control encapsulation film and the third control encapsulation film, and a refractive index of the third control encapsulation film is less than the refractive index of the second control encapsulation film.

In one embodiment, the display device may include a plurality of organic encapsulation films on the display unit, the at least one refractive-index control encapsulation film is between two adjacent organic encapsulation films among the plurality of organic encapsulation films, and the first control encapsulation film is adjacent to one of the two adjacent organic encapsulation films, and the third control encapsulation film is adjacent to the other of the two adjacent organic encapsulation films.

In one embodiment, the third control encapsulation film may be thinner than the second control encapsulation film.

In one embodiment, the display element may include an organic light-emitting diode (OLED).

According to one or more exemplary embodiments, a method of manufacturing a display device includes: forming a display unit on a substrate to display an image; forming at least one organic encapsulation film on the display unit; and forming at least one refractive-index control encapsulation film to be adjacent to the at least one organic encapsulation film, wherein a refractive index of a region of the at least one refractive-index control encapsulation film closer to the at least one organic encapsulation film is closer to a refractive index of the at least one organic encapsulation film than a refractive index of a region of the at least one refractive-index control encapsulation film further from the at least one organic encapsulation film.

In one embodiment, forming the at least one refractive-index control encapsulation film may be performed using a deposition process, wherein, during the deposition process, controlling a type and amount of a source gas such that the refractive index of the at least one refractive-index control encapsulation film gradually increases from the region of the at least one refractive-index control encapsulation film closer to the at least one organic encapsulation film towards the region of the at least one refractive-index control encapsulation film distant from the at least one organic encapsulation film.

According to one or more exemplary embodiments, a display device includes a substrate, a display unit on the substrate and including a display element for displaying an image, at least one organic encapsulation film on the display unit, at least one inorganic encapsulation film on the display unit, and at least one refractive-index control encapsulation film between adjacent ones of the at least one organic encapsulation film and the at least one inorganic encapsulation film, wherein a refractive index of the at least one refractive-index control encapsulation film is between a refractive index of the at least one organic encapsulation film and a refractive index of the at least one inorganic encapsulation film.

The refractive index of the at least one refractive-index control encapsulation film may gradually change from the refractive index of the at least one organic encapsulation film to the refractive index of the at least one inorganic encapsulation film.

BRIEF DESCRIPTION OF THE DRAWINGS

Features will become apparent to those of skill in the art by describing in detail exemplary embodiments with reference to the attached drawings in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It would be obvious to those of ordinary skill in the art that exemplary embodiments are to cover all modifications, equivalents, and alternatives falling within the scope of the inventive concept. In the following description, well-known functions or constructions are not described in detail if it is determined that they would obscure the inventive concept due to unnecessary detail.

It will be understood that although the terms "first", "second", etc. may be used herein to describe various components, these components should not be limited by these terms. These terms are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

In the drawings, components that are substantially the same or that correspond to each other will be denoted by the same reference numeral and will not be redundantly described here. Sizes of elements in the drawings may be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

Figure 1:
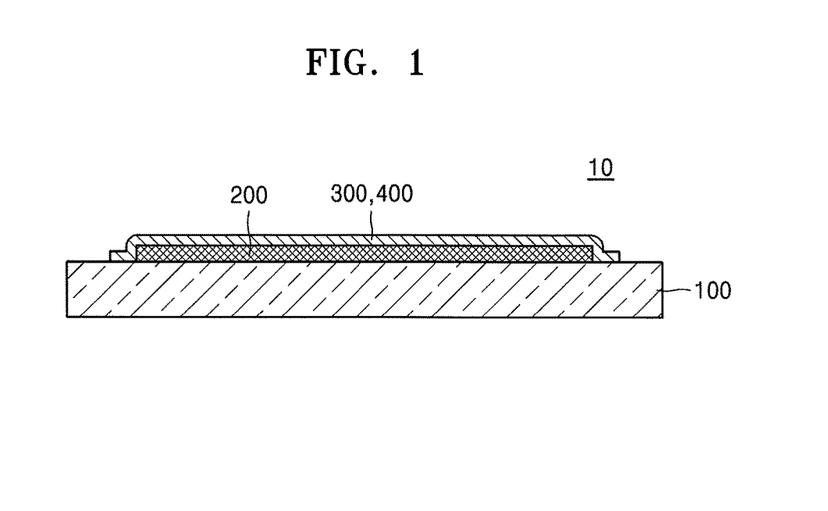
FIG. 1 illustrates a schematic cross-sectional view of a display device according to an exemplary embodiment.

FIG. 1 illustrates a schematic cross-sectional view of a display device 10 according to an exemplary embodiment. Referring to FIG. 1, the display device 10 according to an exemplary embodiment includes a substrate 100, a display unit 200, and an encapsulation unit 300. The encapsulation unit 300 includes an organic encapsulation film 312 and a refractive-index control encapsulation film 313.

The substrate 100 may be formed of a glass material containing $SiO_2$ as a main ingredient. However, the substrate 100 is not limited thereto and may be formed of a plastic material. The plastic material may be an insulating organic material selected from at least one of polyethersulphone (PES), polyacrylate (PAR), polyetherimide (PEI), polyethyelenen napthalate (PEN), polyethyelene terepthalate (PET), polyphenylene sulfide (PPS), polyallylate, polyimide, polycarbonate (PC), cellulose triacetate (TAC), and cellulose acetate propionate (CAP).

When the display device 10 is a bottom emission type, in which an image is formed in a direction of the substrate 100, the substrate 100 should be formed of a transparent material. However, when the display device 10 is a top emission type, in which an image is formed in a direction opposite the substrate 100, the substrate 100 need not be formed of a transparent material. In this case, the substrate 100 may be formed of a metal. When the substrate 100 is formed of a metal, the substrate 100 may include, but is not limited to, at least one of carbon, iron, chromium, manganese, nickel, titanium, molybdenum, stainless steel, an Invar alloy, an Inconel alloy, and a Kovar® alloy.

The display unit 200 is formed on the substrate 100. The display unit 200 includes an organic light-emitting diode (OLED), a liquid crystal device, or another display element, and provides an image that is recognizable to a user. For convenience of explanation, it is assumed in the present disclosure that a display device according to an exemplary embodiment is an organic light-emitting display device with OLEDs. The display unit 200 will be described in detail with reference to FIG. 6 below.

The encapsulation unit 300 is formed on the display unit 200 to seal the display unit 200. The encapsulation unit 300 may extend to cover not only a top surface of the display unit 200, but also side surfaces of the display unit 200, and may be in contact, e.g., direct contact, with a portion of the substrate 100. Thus, the encapsulation unit 300 prevents external oxygen and moisture from penetrating the display unit 200.

Figure 2:
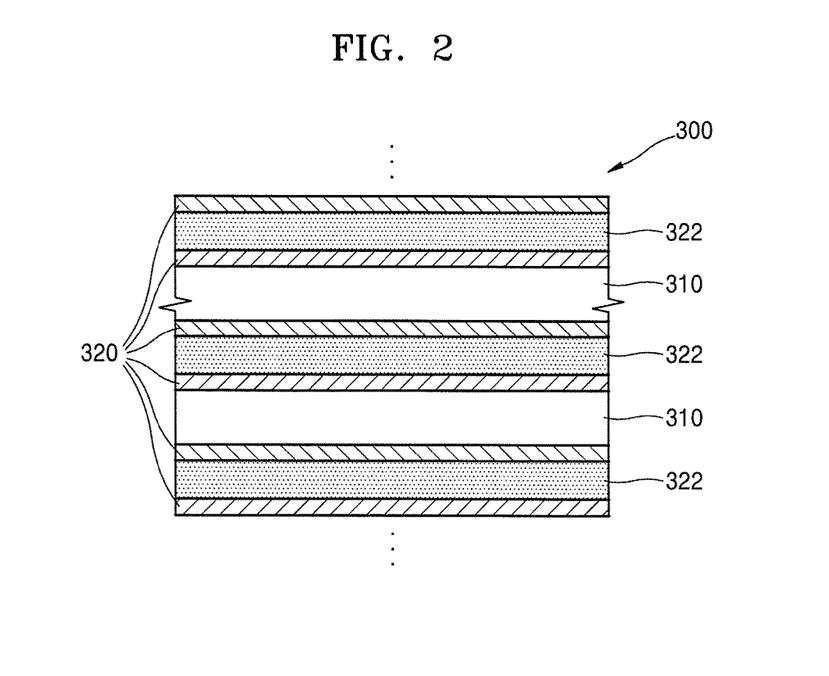
FIG. 2 illustrates a schematic cross-sectional view of an encapsulation unit of the display device of FIG. 1 according to an exemplary embodiment.

FIG. 2 is a schematic cross-sectional view of the encapsulation unit 300 of the display device 10 of FIG. 1 according to an exemplary embodiment. Referring to FIG. 2, the encapsulation unit 300 includes an organic encapsulation film 310 and a refractive-index control encapsulation film 320. The encapsulation unit 300 may include a plurality of organic encapsulation films 310. At least one refractive-index control encapsulation film 320 may be between two adjacent organic encapsulation films 310 among the plurality of organic encapsulation films 310. The encapsulation unit 300 may further include at least one inorganic encapsulation film 322.

Alternatively, the refractive-index control encapsulation film 320 may be between the organic encapsulation film 310 and the inorganic encapsulation film 322. For example, in the encapsulation unit 300, a first refractive-index control encapsulation film 320, a first inorganic encapsulation film 322, a second refractive-index control encapsulation film 320, a first organic encapsulation film 310, a third refractive-index control encapsulation film 320, a second inorganic encapsulation film 322, a fourth refractive-index control encapsulation film 320, a second organic encapsulation film 310, a fifth refractive-index control encapsulation film 320, a third inorganic encapsulation film 322, and a sixth refractive-index control encapsulation film 320 may be sequentially stacked on the OLED of the display unit 200. That is, the encapsulation unit 300 may include at least one sandwich structure in which the refractive-index control encapsulation film 320, the inorganic encapsulation film 322, the refractive-index control encapsulation film 320, the organic encapsulation film 310, and the refractive-index control encapsulation film 320 are sequentially stacked on the OLED.

According to another exemplary embodiment, in the encapsulation unit 300, a first refractive-index control encapsulation film 320, a first inorganic encapsulation film 322, a first organic encapsulation film 310, a second refractive-index control encapsulation film 320, a second inorganic encapsulation film 322, a second organic encapsulation film 310, and a third refractive-index control encapsulation film 320 may be sequentially stacked on the OLED. That is, the encapsulation unit 300 may include at least one sandwich structure in which the refractive-index control encapsulation film 320, the inorganic encapsulation film 322, the organic encapsulation film 310, and the refractive-index control encapsulation film 320 are sequentially stacked on the OLED.

In this case, an area of the organic encapsulation film 310 adjacent to the top of the OLED may be set to be less than that of the inorganic encapsulation film 322 above the organic encapsulation film 310. As another example, the organic encapsulation film 310 may be completely covered with the inorganic encapsulation film 322 above the organic encapsulation film 310.

The encapsulation unit 300 employs a general thin-film encapsulation structure including at least one organic encapsulation film 310 and at least one inorganic encapsulation film 322, except that the refractive-index control encapsulation film 320 is between the organic encapsulation film 310 and the inorganic encapsulation film 322. Thus, the encapsulation unit 300 may include at least one sandwich structure in which at least one organic encapsulation film 310 is between at least two inorganic encapsulation films 322. As another example, the encapsulation unit 300 may include at least one sandwich structure in which at least one inorganic encapsulation film 322 is between at least two organic encapsulation films 310. As another example, the encapsulation unit 300 may include at least one sandwich structure in which at least one organic encapsulation film 310 is between at least two inorganic encapsulation films 322, and at least one sandwich structure in which between at least one inorganic encapsulation film 322 is between at least two organic encapsulation films 310. However, in the encapsulation unit 300, the inorganic encapsulation film 322 may be an uppermost layer exposed to the outside to protect the encapsulation unit 300.

A refractive index of the organic encapsulation film 310 is less than that of the inorganic encapsulation film 322, and the refractive-index control encapsulation film 320 between the organic encapsulation film 310 and the inorganic encapsulation film 322 has a gradient in the refractive index thereof that changes, e.g., continuously changes, in a direction of the thickness of the refractive-index control encapsulation film 320.

The refractive index of the refractive-index control encapsulation film 320 may gradually increase from a region adjacent the refractive-index control encapsulation film 320 close to the organic encapsulation film 310 to a region adjacent the refractive-index control encapsulation film 320 spaced from the organic encapsulation film 310. That is, the refractive index of the refractive-index control encapsulation film 320 gradually increases from the organic encapsulation film 310 to the inorganic encapsulation film 322. Thus, the refractive index of the refractive-index control encapsulation film 320 may gradually increase in a direction from each of side surfaces of the refractive-index control encapsulation film 320 facing two adjacent organic encapsulation films 310 towards the center of the refractive-index control encapsulation film 320.

Since the refractive-index control encapsulation film 320 is between the organic encapsulation film 310 and the inorganic encapsulation film 322, light emitted from the OLED may be suppressed from being partially reflected from an interface between the organic encapsulation film 310 and the inorganic encapsulation film 322 when the light passes through the encapsulation unit 300. That is, Fresnel reflection may be prevented from occurring at the interface between the organic encapsulation film 310 and the inorganic encapsulation film 322 due to a refractive index difference therebetween, based on a principle that optical loss due to light reflection decreases when a refractive index difference between media through which light passes is set to be changed, e.g., gradually changed.

Fresnel reflection is a phenomenon that when light is incident from one medium onto another medium having a different refractive index than that of the medium, the light is partially reflected from an interface between the media due to the difference between the refractive indexes of the media. This phenomenon may be decreased by controlling the difference between the refractive indexes to be gradually changed. Thus, in order to minimize a degree of light reflection at an interface between an inorganic material and an organic material, the refractive-index control encapsulation film 320 having a gradient in the refractive index thereof that changes, e.g., gradually increases or decreases, between an inorganic or high index material and an organic or low index material is between the organic encapsulation film 310 and the inorganic encapsulation film 322

For example, when the inorganic encapsulation film 322, the refractive-index control encapsulation film 320, and the organic encapsulation film 310 are sequentially stacked, a gradient in a refractive index occurs in a direction of the thicknesses thereof, i.e., a direction in which light is emitted, such that a refractive index gradually increases from the inorganic encapsulation film 322 with a highest refractive index to the organic encapsulation film 310 with a lowest refractive index. In contrast, in a structure in which the organic encapsulation film 310, the refractive-index control encapsulation film 320, and the inorganic encapsulation film 322 are sequentially stacked, a gradient in a refractive index occurs in a direction in which light is emitted such that a refractive index gradually increases from the organic encapsulation film 310 with the lowest refractive index to the inorganic encapsulation film 322 with the highest refractive index.

An effect of improving the transmittance of light in the encapsulation unit 300 including the refractive-index control encapsulation film 320 having such a gradient in a refractive index thereof will be described in more detail below.

Figure 3:
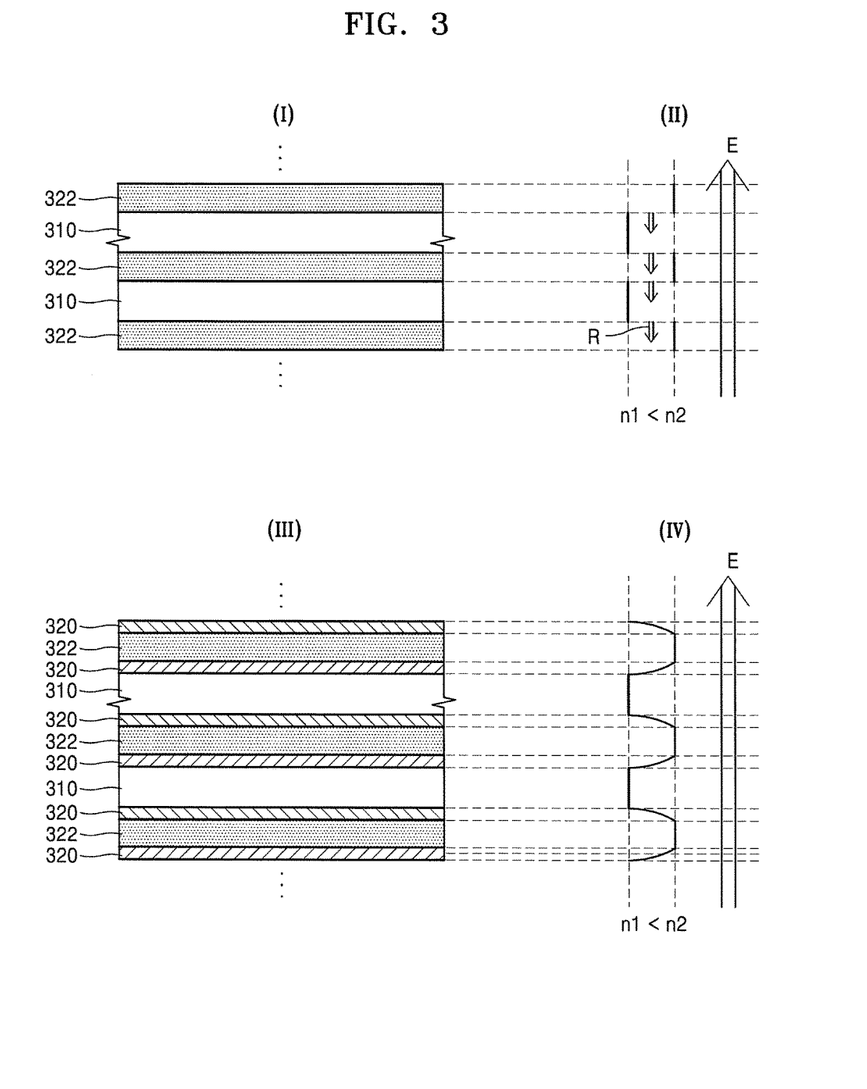
FIG. 3 illustrates a diagram comparing effects when a refractive-index control encapsulation film of FIG. 2 is present and when the refractive-index control encapsulation film is not present.
Figure 4:
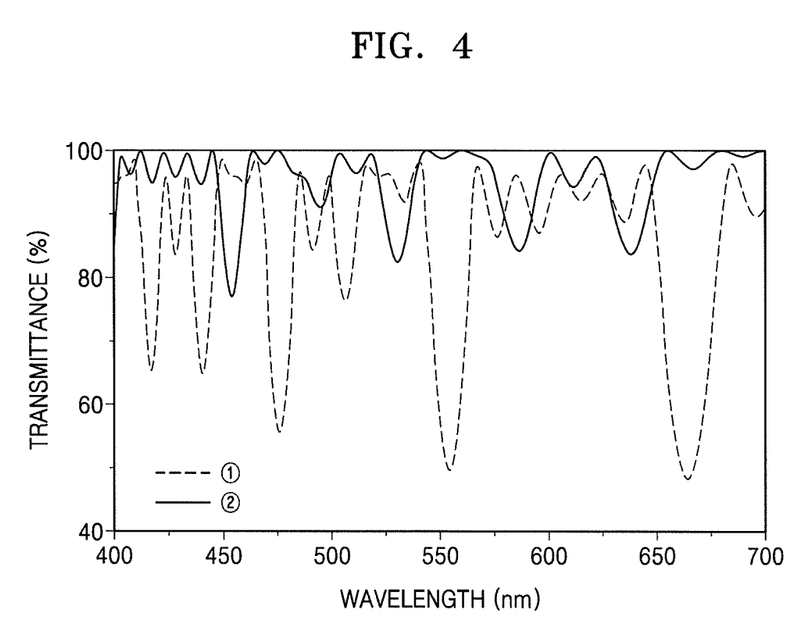
FIG. 4 illustrates a graph of a change in the transmittance of emitted from a display device including the encapsulation unit of FIG. 2 according to a wavelength of the light.

FIG. 3 is a diagram comparing effects when a refractive-index control encapsulation film 320 is not present and when the refractive-index control encapsulation film 320 is present. FIG. 4 is a graph illustrating a change in the transmittance of light emitted from a display device including the encapsulation unit 300 of FIG. 2 according to a wavelength of the light.

FIG. 3(I) illustrates a thin-film stack structure of an encapsulation unit that does not include the refractive-index control encapsulation film 320. FIG. 3(II) is a graph illustrating a gradient in a refractive index of each of thin films included in the encapsulation unit of FIG. 3(I) and stacked in a direction in which light is emitted, and a manner in which light is reflected. FIG. 3(III) illustrates a thin-film stack structure of an encapsulation unit that includes the refractive-index control encapsulation film 320. FIG. 3(IV) is a graph illustrating a gradient in a refractive index of each of thin films included in the encapsulation unit of FIG. 3(III) and stacked in a direction in which light is emitted, and a manner in which light is reflected.

First, referring to FIGS. 3(I) and (II), in the thin-film stack structure in which the organic encapsulation film 310 and the inorganic encapsulation film 322 are alternately stacked without the refractive-index control encapsulation film 320, the refractive indexes of these thin films stacked in which light E is emitted sharply changes in a step form. Thus, reflected light R is generated at an interface between the organic encapsulation film 310 with a low refractive index and the inorganic encapsulation film 322 with a high refractive index in a direction opposite the direction in which the light E is emitted, due to Fresnel reflection, thereby reducing the transmittance of light in a display device.

In contrast, referring to FIGS. 3(III) and (IV), when the refractive-index control encapsulation film 320 is between the organic encapsulation film 310 and the inorganic encapsulation film 322, a gradient in refractive indexes of these thin films stacked in which the direction in which the light E is emitted continuously increases or decreases gradually, e.g., in a parabolic form. That is, since the refractive index of the refractive-index control encapsulation film 320 continuously increases or decreases in the direction in which the light E is emitted, the refractive-index control encapsulation film 320 may act as a buffer film that lessens the effect of a sharp refractive index difference between the organic encapsulation film 310 and the inorganic encapsulation film 322. Thus, loss of the emitted light E caused by Fresnel reflection may be minimized by optimizing a refractive index gradient of the refractive-index control encapsulation film 320.

Referring to FIG. 4, a graph ① shows a distribution of light transmittance of an encapsulation unit that includes a refractive-index control encapsulation film having a gradient in the refractive index thereof that gradually increases or decreases, and a graph ② shows a distribution of light transmittance of an encapsulation unit that does not include such a refractive-index control encapsulation film.

That is, when a wavelength of emitted light is 400 nm or more, the light transmission of the encapsulation unit including the refractive-index control encapsulation film (see the graph ①) is improved in a wide wavelength range, compared to the encapsulation unit that does not include the refractive-index control encapsulation film (see the graph ②). More specifically, when the encapsulation unit including the refractive-index control encapsulation film is used, an average light transmittance of a display device may be 70% or more when a wavelength of emitted light is in a range of 450 nm to 700 nm.

Figure 5:
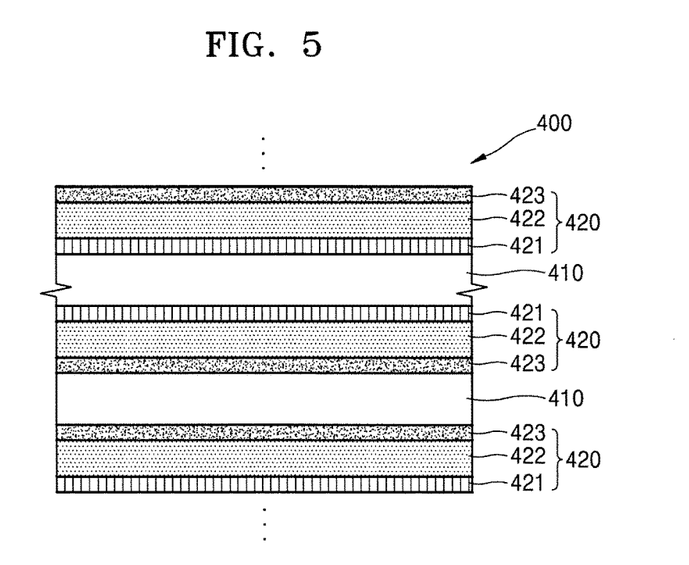
FIG. 5 illustrates a schematic cross-sectional view of an encapsulation unit of the display device of FIG. 1 according to another exemplary embodiment.

According to another exemplary embodiment, a refractive-index control encapsulation film may be set to have a specific refractive index rather than having a continuous gradient in a refractive index, and a plurality of such refractive-index control encapsulation films may be disposed between two adjacent organic encapsulation films.

FIG. 5 is a schematic cross-sectional view of an encapsulation unit 400 of the display device of FIG. 1 according to another exemplary embodiment. Referring to FIG. 5, the encapsulation unit 400 includes an organic encapsulation film 410 and a refractive-index control encapsulation film 420 with a plurality of films. Alternatively, the encapsulation unit 400 may include a plurality of organic encapsulation films 410, and the refractive-index control encapsulation film 420 is between two adjacent organic encapsulation films 410 among the plurality of organic encapsulation films 410.

The refractive-index control encapsulation film 420 may have a structure in which a plurality of single films each having an optimum refractive index to minimize Fresnel reflection are stacked, rather than having a gradient in a refractive index that gradually increases or decreases.

The refractive-index control encapsulation film 420 includes a first control encapsulation film 421 adjacent to the organic encapsulation film 410, and a second control encapsulation film 422 adjacent to the first control encapsulation film 421 and further from the organic encapsulation film 410 than the first control encapsulation film 421. In this case, a refractive index of the first control encapsulation film 421 is closer to a refractive index of the organic encapsulation film 410 than a refractive index of the second control encapsulation film 422. More specifically, the refractive index of the first control encapsulation film 421 is less than the refractive index of the second control encapsulation film 422, and the refractive index of the organic encapsulation film 410 is less than the refractive index of the first control encapsulation film 411.

The refractive-index control encapsulation film 420 may further include a third control encapsulation film 423. The second control encapsulation film 422 is between the first control encapsulation film 421 and the third control encapsulation film 423. Another organic encapsulation film 410 may be disposed on the third control encapsulation film 423. A refractive index of the third control encapsulation film 423 is less than that of the second control encapsulation film 422.

As described above, the refractive-index control encapsulation film 420 is disposed between two adjacent organic encapsulation films 410 among the plurality of organic encapsulation films 410, and the first control encapsulation film 421 may be arranged adjacent to one of the two adjacent organic encapsulation films 410, and the third control encapsulation film 423 is adjacent to the other two adjacent organic encapsulation films 410.

Thus, when the organic encapsulation film 410, the first control encapsulation film 421, the second control encapsulation film 422, the third control encapsulation film 423, and the other organic encapsulation film 410 are sequentially stacked, a gradient in refractive index occurs such that the refractive index gradually increases from the organic encapsulation film 410 with a lowest refractive index with the second control encapsulation film 422 with a highest refractive index and then gradually decreases in the third control encapsulation film 423 and the other organic encapsulation film 410, in a direction of the thicknesses of the encapsulation films, i.e., a direction in which light is emitted.

The thickness of the refractive-index control encapsulation film 420 may be described as will be described below. When the refractive index of a film below the refractive-index control encapsulation film 420 is less than that of the refractive-index control encapsulation film 420, the refractive-index control encapsulation film 420 is formed to a thickness corresponding to an integral multiple of $\lambda/2n$. Here, '$\lambda$' denotes the wavelength of emitted light and '$n$' denotes the refractive index of the refractive-index control encapsulation film 420. For example, since the refractive index of the organic encapsulation film 410 below the first control encapsulation film 421 is less than that of the first control encapsulation film 421, the first control encapsulation film 421 is formed to a thickness corresponding to an integral multiple of $\lambda/2n$. Here, '$\lambda$' denotes the wavelength of the emitted light and '$n$' denotes the refractive index of the first control encapsulation film 421.

In contrast, when the refractive index of a film below the refractive-index control encapsulation film 420 is greater than that of the refractive-index control encapsulation film 420, the refractive-index control encapsulation film 420 is formed to a thickness corresponding to an integral multiple of $\lambda/4n$. Here, '$\lambda$' denotes the wavelength of emitted light and '$n$' denotes the refractive index of the refractive-index control encapsulation film 420. For example, since the refractive index of the second control encapsulation film 422 below the third control encapsulation film 423 is greater than that of the second control encapsulation film 422, the third control encapsulation film 423 is formed to a thickness corresponding to an integral multiple of $\lambda/4n$. Here, '$\lambda$' denotes the wavelength of the emitted light and '$n$' denotes the refractive index of the third control encapsulation film 423.

In the encapsulation units 300 and 400 of FIGS. 2 and 5, the organic encapsulation films 310 and 410 may be formed using an organic polymeric compound. The organic encapsulation films 310 and 410 may be each a single film or a multi-layer film formed of at least one material selected from polyethyleneterephthalate, polyimide (PI), polycarbonate, epoxy, polyethylene, and polyacrylate. For example, the organic encapsulation films 310 and 410 may be formed of polyacrylate. In detail, the organic encapsulation films 310 and 410 may each include a polymerized monomer composition including a diacrylate-based monomer and a triacrylate-based monomer. The monomer composition may further include a monoacryl-based monomer. The monomer composition may further include a well-known photoinitiator, e.g., monoacrylphosphine oxide (TPO), but is not limited thereto.

The inorganic encapsulation film 322 of FIG. 2 may be a single film or a multi-layer film including a metal oxide or a metal nitride which is an inorganic material. The inorganic encapsulation film 322 may be formed of at least one of a silicon nitride and a silicon carbonitride.

The refractive-index control encapsulation films 320 and 420 may be also a single film or a multi-layer film including at least one inorganic material. The refractive-index control encapsulation films 320 and 420 may be formed of a silicon oxide. In this case, the second control encapsulation film 422 of FIG. 5 may be formed of the same material as the inorganic encapsulation film 322 of FIG. 2 but is not limited thereto. The refractive-index control encapsulation films 320 and 420 may be formed of an organic material having a higher refractive index than those of the organic encapsulation films 310 and 410. Hereinafter, the second control encapsulation film 422 will be assumed to be an inorganic film for convenience of explanation.

As illustrated in FIG. 2, the refractive-index control encapsulation film 320 is thinner than the inorganic encapsulation film 322. Also, as illustrated in FIG. 5, the first and third control encapsulation films 421 and 423 are thinner than the second control encapsulation film 422. This is because when the refractive-index control encapsulation films 320, 421, and 423 between the organic encapsulation films 310 and 410 and the inorganic encapsulation films 322 and 422 are thicker than the inorganic encapsulation films 322 and 422 on or below the refractive-index control encapsulation films 320, 421, and 423, interference may increase due to a multi-layer thin film and the heights of the whole encapsulation units 300 and 400 may increase, thereby preventing the display device 10 from being manufactured to be thinner and/or flexible.

The organic encapsulation films 310 and 410 may be formed to be thicker than the inorganic encapsulation films 322 and 422 so as to planarize the thin films of the encapsulation units 300 and 400 and add flexibility to the thin films, considering that processes are limited when a monomer is deposited.

Referring back to FIG. 1, the encapsulation units 300 and 400 described above are formed on the display unit 200 to cover the display unit 200. The display unit 200 may be formed on the substrate 100, and may include a thin-film transistor (TFT) and an OLED. The display unit 200 will be described in detail with reference to FIG. 6 below.

Figure 6:
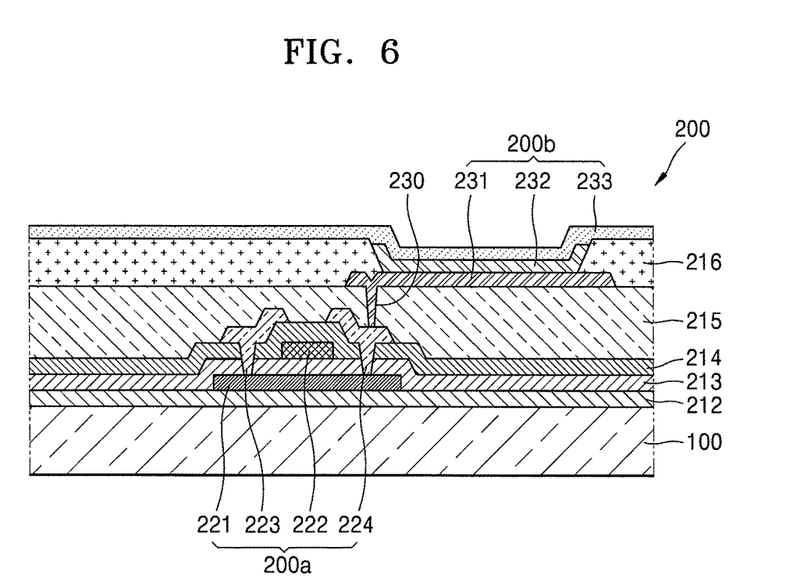
FIG. 6 illustrates a schematic cross-sectional view of a display unit of the display device of FIG. 1 according to an exemplary embodiment.

FIG. 6 is a schematic cross-sectional view of the display unit 200 of the display device 10 of FIG. 1 according to an exemplary embodiment. As described above, it is assumed that, for convenience of explanation, the display unit 200 includes an OLED to display an image.

A buffer layer 212 may be formed on the substrate 100. The buffer layer 212 prevents impurity elements from penetrating the substrate 100 and provides a flat surface on the substrate 100. The buffer layer 212 may be formed of various materials to perform the above functions. For example, the buffer layer 212 may include an inorganic material such as silicon oxide ($SiO_x$), silicon nitride ($SiN_x$), silicon oxynitride ($SiO_xN_y$), aluminum oxide, aluminum nitride, titanium oxide, or titanium nitride; an organic material such as polyimide (PI), polyester, or acrylic; or a multi-layer film including at least one among these materials.

An active layer 221 may be formed on the buffer layer 212 by using an inorganic semiconductor such as silicon or an organic semiconductor. The active layer 221 includes a source region, a drain region, and a channel region between the source region and the drain region. For example, when the active layer 221 is formed of amorphous silicon, the active layer 221 including the source region, the drain region, and the channel region between the source region and the drain region may be formed by forming an amorphous silicon layer on the entire substrate 100, crystallizing the amorphous silicon layer to form a polycrystalline silicon layer, patterning the polycrystalline silicon layer, and doping impurities into a source region and a drain region at edges of the resultant structure.

A gate insulating film 213 is formed on the active layer 221. The gate insulating film 213 insulates the active layer 221 and a gate electrode 222 from each other and may be formed of an inorganic material such as silicon nitride ($SiN_x$), silicon oxide ($SiO_2$), etc.

The gate electrode 222 is formed in a predetermined upper region of the gate insulating film 213. The gate electrode 222 is connected to a gate line (not shown) for supplying an 'on'/'off' signal to the TFT.

The gate electrode 222 may include Au, Ag, Cu, Ni, Pt, Pd, Al, or Mo or an alloy such as an Al:Nd alloy or a Mo:W alloy but is not limited thereto and may be formed of various materials in consideration of design conditions.

An interlayer insulating film 214 formed on the gate electrode 222 insulates the gate electrode 222, a source electrode 223, and a drain electrode 224 from one another and, and may be formed of an inorganic material such as $SiN_x$, $SiO_2$, etc.

The source electrode 223 and the drain electrode 224 are formed on the interlayer insulating film 214. In detail, the interlayer insulating film 214 and the gate insulating film 213 are formed to expose the source region and the drain region of the active layer 221. The source electrode 223 and the drain electrode 224 are formed to be in contact with the exposed source region and drain region of the active layer 221.

Although FIG. 2 illustrates a top gate type TFT in which the active layer 221, the gate electrode 222, the source electrode 223, and the drain electrode 224 are sequentially formed, exemplary embodiments are not limited thereto and the gate electrode 222 may be disposed below the active layer 221.

Such a TFT 200a is electrically connected to an OLED 200b to drive the OLED 200b, and is protected by being covered with a planarizing film 215.

The planarizing film 215 may include an inorganic insulating film and/or an organic insulating film. The inorganic insulating film may include $SiO_2$, $SiN_x$, SiON, $Al_2O_3$, $TiO_2$, $Ta_2O_5$, $HfO_2$, $ZrO_2$, BST, PZT, etc. The organic insulating film may include a general-purpose polymer (PMMA or PS), a polymeric derivative having a phenol-based group, an acryl-based polymer, an imide-based polymer, an arylether-based polymer, an amide-based polymer, a fluorine-based polymer, a p-xylene-based polymer, a vinyl alcohol-based polymer, a mixture thereof, etc. Also, the planarizing film 215 may be a composite stack structure of an inorganic insulating film and an organic insulating film.

The OLED 200b may include a pixel electrode 231, an intermediate layer 232, and an opposite electrode 233.

The pixel electrode 231 is formed on the planarizing film 215, and is electrically connected to the drain electrode 224 via a contact hole 230 formed in the planarizing film 215.

The pixel electrode 231 may be a reflective electrode, and include a reflective film formed of Ag, Mg, Al, Pt, Pd, Au, Ni, Nd, Ir, Cr, or a mixture thereof and a transparent or semi-transparent electrode layer formed on the reflective film. The transparent or semi-transparent electrode layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 disposed opposite the pixel electrode 231 may be a transparent or semi-transparent electrode, and may be formed of a metal thin film having a low work function and including Li, Ca, LiF/Ca, LiF/Al, Al, Ag, Mg, or a mixture thereof. Also, an auxiliary electrode layer or a bus electrode may be further formed on the metal thin film by using a transparent electrode forming material such as ITO, IZO, ZnO, $In_2O_3$, etc.

Thus, the opposite electrode 233 may allow light emitted from an organic emission layer (not shown) included in the intermediate layer 232 to pass through. That is, the light emitted from the organic emission layer may be emitted directly toward the opposite electrode 233 or may be reflected from the pixel electrode 231 configured as a reflective electrode and emitted toward the opposite electrode 233.

However, the display device 10 according to the present embodiment is not limited to a top emission type and may be a bottom emission type in which light emitted from the organic emission layer is discharged toward the substrate 100. In this case, the pixel electrode 231 may be a transparent or semi-transparent electrode and the opposite electrode 233 may be a reflective electrode. Otherwise, the display device 10 according to the present embodiment may be a dual emission type in which light is emitted in both a forward direction and a backward direction.

A pixel defining film 216 may be formed on the pixel electrode 231 by using an insulating material. The pixel defining film 216 may be formed by spin coating and using at least one organic insulating material selected from the group consisting of polyimide (PI), polyamide, acrylic resin, benzocyclobutene (BCB) and phenol resin. The pixel defining film 216 exposes a predetermined region of the pixel electrode 231, and the intermediate layer 232 including the organic emission layer is formed on the exposed region of the pixel electrode 231.

The organic emission layer included in the intermediate layer 232 may be a low molecular weight organic material or a high molecular weight organic material. In addition to the organic emission layer, the intermediate layer 232 may selectively further include a functional layer such as a hole transport layer (HTL), a hole injection layer (HIL), an electron transport layer (ETL), an electron injection layer (EIL), etc.

A method of manufacturing the display device 10 according to an exemplary embodiment will now be described.

Referring to FIGS. 2, 5, and 6, first, the display unit 200 is formed on the substrate 100. Here, the display unit 200 is formed by forming a TFT array, forming the pixel electrode 231 on the TFT array, and forming the pixel defining film 216 on the pixel electrode 231. An opening is formed in the pixel defining film 216 to expose a central portion of the pixel electrode 231, and an organic emission layer (not shown) emitting light is formed in a region defined by the opening to define a light-emitting region. This process has been described above and is thus not described again here.

Next, the encapsulation unit 300 or 400 is formed on the display unit 200 to cover the display unit 200. An additional layer such as a protective layer (not shown) may be included between the encapsulation unit 300 or 400 and the OLED 200*b*

Referring to FIG. 2, the inorganic encapsulation film 322 is formed to a predetermined thickness, the refractive-index control encapsulation film 320 is formed on the inorganic encapsulation film 322, and the organic encapsulation film 310 is formed on the refractive-index control encapsulation film 320. Next, the refractive-index control encapsulation film 320 or the inorganic encapsulation film 322 is formed on the organic encapsulation film 310. In order to form the encapsulation unit 300, a process of stacking the inorganic encapsulation film 322, the refractive-index control encapsulation film 320, and the organic encapsulation film 310 may be repeatedly performed several times. Also, the refractive-index control encapsulation film 320 may be first formed on the display unit 200 instead of the inorganic encapsulation film 322.

According to another exemplary embodiment, as illustrated in FIG. 5, first, the first control encapsulation film 421 is formed on the display unit 200 to a predetermined thickness, the second control encapsulation film 422 is formed on the first control encapsulation film 421, and the third control encapsulation film 423 is formed on the second control encapsulation film 422. Then, the organic encapsulation film 410 is formed on the third control encapsulation film 423. In this case, the third control encapsulation film 423 may be omitted.

The refractive-index control encapsulation films 320 and 420 may be formed according to a deposition process. A method of forming the refractive-index control encapsulation film 320 or 420 will now be described in more detail below.

The refractive-index control encapsulation film 320 of FIG. 2 is formed by controlling the type and amount of a source gas during the deposition process such that the refractive index of the refractive-index control encapsulation film 320 gradually increases from a region of the refractive-index control encapsulation film 320 close to the organic encapsulation film 310 towards a region of the refractive-index control encapsulation film 320 distant from the organic encapsulation film 310.

The refractive-index control encapsulation film 320 and the inorganic encapsulation film 322 may be formed by chemical vapor deposition (CVD) such as plasma enhanced CVD (PECVD), atmospheric pressure CVD (APCVD), or low pressure CVD (LPCVD). In this case, at least one gas among $SiH_4$, $NH_3$, He, and $N_2O$ may be used to react with the refractive-index control encapsulation film 320 and the inorganic encapsulation film 322. By appropriately combining the at least gas, silicon oxide, silicon nitride, silicon carbonitride, etc. may be easily deposited in a single process.

In particular, the refractive indexes of the refractive-index control encapsulation film 320 and the inorganic encapsulation film 322 may be controlled differently according to a composition ratio of the at least one gas. That is, when an atmosphere in a chamber is formed by changing a composition ratio of $SiH_4$, $NH_3$, He, and $N_2O$, the refractive indexes of thin films to be deposited may be variously controlled. In particular, the refractive index of the refractive-index control encapsulation film 320 may be controlled to have a continuous gradient in the refractive index thereof in a range that is equal to or greater than 1.0 and less than 2.5. Table 1 below shows a result of measuring the refractive indexes of the refractive-index control encapsulation film 320 and the inorganic encapsulation film 322 of the encapsulation unit 300 according to an exemplary embodiment according to a composition ratio of the at least one gas.

TABLE 1

| $SiH_4$ (sccm) | $NH_3$ (sccm) | He (sccm) | $N_2O$ (sccm) | refractive index |
|---|---|---|---|---|
| 0.5 | — | 25 | 40 | 1.44 |
| 4 | 4 | 25 | 40 | 1.53 |
| 4 | 4 | 25 | 10 | 1.62 |
| 0.5 | 6 | 25 | — | 1.75 |
| 9.5 | 4 | 25 | — | 2.12 |

The above process is also applicable to forming the refractive-index control encapsulation film 420 of FIG. 5.

The areas, thicknesses, and materials of the organic encapsulation films 310 and 410, the refractive-index control encapsulation films 320 and 420, and the inorganic encapsulation films 322 and 422 of the encapsulation units 300 and 400 have been described above and are thus not described again here.

As described above, in the display device 10 according to the one or more of the above embodiments, the refractive-index control encapsulation film 320 or 420 is disposed in the encapsulation unit 300 or 400 to improve the optical feature of the encapsulation unit 300 or 400 and the transmittance of light discharged to the outside.

Also, in a method of manufacturing the display device 10 according to the one or more of the above embodiments, the optical feature of the encapsulation unit 300 or 400 is improved by directly using the existing deposition process, thereby increasing the convenience of the process and decreasing costs of the process.

As described above, in a display device according to the one or more of the above exemplary embodiments, a refractive-index control encapsulation film is disposed in an encapsulation unit to improve the optical feature of the encapsulation unit and the transmittance of light discharged to the outside.

Also, in a method of manufacturing a display device according to the one or more of the above embodiments, the optical feature of an encapsulation unit is improved by directly using the existing deposition process, thereby increasing the convenience of the process and decreasing costs of the process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a substrate;
    a display unit on the substrate and including a display element for displaying an image;
    at least one organic encapsulation film on the display unit; and
    at least one refractive-index control encapsulation film adjacent to the at least one organic encapsulation film, the at least one refractive-index control encapsulation film having a gradient refractive index,
    wherein a first refractive index of a region of the at least one refractive-index control encapsulation film adjacent to the at least one organic encapsulation film is closer to a refractive index of the at least one organic encapsulation film than a second refractive index of a region of the at least one refractive-index control encapsulation film spaced apart from the at least one organic encapsulation film is to the refractive index of the at least one organic encapsulation film.

2. The display device as claimed in claim 1, wherein the gradient refractive index of the at least one refractive-index control encapsulation film gradually increases from the first refractive index to the second refractive index.

3. The display device as claimed in claim 1, wherein the at least one refractive-index control encapsulation film includes an inorganic material.

4. The display device as claimed in claim 3, wherein the at least one refractive-index control encapsulation film includes silicon oxide.

5. The display device as claimed in claim 3, further comprising at least one inorganic encapsulation film on the display unit, wherein the at least one refractive-index control encapsulation film is between the at least one organic encapsulation film and the at least one inorganic encapsulation film.

6. The display device as claimed in claim 3, wherein the gradient refractive index of the at least one refractive-index control encapsulation film gradually increases from the at least one organic encapsulation film towards the at least one inorganic encapsulation film.

7. The display device as claimed in claim 3, wherein the at least one refractive-index control encapsulation film is thinner than the at least one inorganic encapsulation film.

8. The display device as claimed in claim 1, wherein:
    the display device includes a plurality of organic encapsulation films on the display unit,
    the at least one refractive-index control encapsulation film is at least between two adjacent organic encapsulation films among the plurality of organic encapsulation films, and
    the gradient refractive index of the at least one refractive-index control encapsulation film gradually increases from surfaces of the at least one refractive-index control encapsulation film facing the two adjacent organic encapsulation films towards a center of the at least one refractive-index control encapsulation film.

9. The display device as claimed in claim 1, wherein the at least one refractive-index control encapsulation film includes:
    a first control encapsulation film having the first refractive index; and
    a second control encapsulation film adjacent to the first control encapsulation film and further from the at least one organic encapsulation film than the first control encapsulation film, the second control encapsulation film having the second refractive index,
    wherein the first refractive index is closer to the refractive index of the at least one organic encapsulation film than to the second refractive index.

10. The display device as claimed in claim 9, wherein the first refractive index is less than the second refractive index.

11. The display device as claimed in claim 9, wherein the first control encapsulation film includes silicon oxide.

12. The display device as claimed in claim 9, wherein the first control encapsulation film is thinner than the second control encapsulation film.

13. The display device as claimed in claim 9, wherein:
    the at least one refractive-index control encapsulation film further includes a third control encapsulation film,
    the second control encapsulation film is between the first control encapsulation film and the third control encapsulation film, and
    a third refractive index of the third control encapsulation film is less than the second refractive index.

14. The display device as claimed in claim 13, wherein:
    the display device includes a plurality of organic encapsulation films on the display unit,
    the at least one refractive-index control encapsulation film is at least between two adjacent organic encapsulation films among the plurality of organic encapsulation films, and
    the first control encapsulation film are arranged adjacent to a first one of the two adjacent organic encapsulation films, and the third control encapsulation film are arranged adjacent to a second one of the two adjacent organic encapsulation films.

15. The display device as claimed in claim 13, wherein the third control encapsulation film is thinner than the second control encapsulation film.

16. The display device as claimed in claim 1, wherein the display element comprises an organic light-emitting diode (OLED).

17. A method of manufacturing a display device, the method comprising: forming a display unit on a substrate to display an image; forming at least one organic encapsulation film on the display unit; forming at least one inorganic encapsulation film on the display unit; and forming at least one refractive-index control encapsulation film having a gradient refractive index to be adjacent to ones of the at least one organic encapsulation film and the at least one inorganic encapsulation film, wherein a first refractive index of a region of the at least one refractive-index control encapsulation film adjacent to the at least one organic encapsulation film is closer to a refractive index of the at least one organic encapsulation film than a second refractive index of a region of the at least one refractive-index control encapsulation film spaced apart from the at least one organic encapsulation film is to the refractive index of the at least one organic encapsulation film.

18. The method as claimed in claim 17, wherein forming the at least one refractive-index control encapsulation film is performed using a deposition process, wherein, during the deposition process, the method further includes controlling a type and amount of a source gas such that the gradient refractive index of the at least one refractive-index control encapsulation film gradually increases from the first refractive index to the second refractive index.

19. A display device, comprising:
a substrate;
a display unit on the substrate and including a display element for displaying an image;
at least one organic encapsulation film on the display unit;
at least one inorganic encapsulation film on the display unit; and
at least one refractive-index control encapsulation film between adjacent ones of the at least one organic encapsulation film and the at least one inorganic encapsulation film, wherein a refractive index of the at least one refractive-index control encapsulation film has a value between a refractive index of the at least one organic encapsulation film and a refractive index of the at least one inorganic encapsulation film.

20. The display device as claimed in claim 19, wherein the refractive index of the at least one refractive-index control encapsulation film is a gradient refractive index that gradually changes from the refractive index of the at least one organic encapsulation film to the refractive index of the at least one inorganic encapsulation film.

* * * * *